(12) United States Patent
Imori et al.

(10) Patent No.: US 10,400,342 B2
(45) Date of Patent: Sep. 3, 2019

(54) HIGH PURITY TIN AND METHOD FOR MANUFACTURING SAME

(71) Applicant: JX NIPPON MINING & METALS CORPORATION, Tokyo (JP)

(72) Inventors: Toru Imori, Ibaraki (JP); Kouichi Takemoto, Ibaraki (JP)

(73) Assignee: JX Nippon Mining & Metals Corporation, Tokyo (JP)

( * ) Notice: Subject to any disclaimer, the term of this patent is extended or adjusted under 35 U.S.C. 154(b) by 30 days.

(21) Appl. No.: 15/574,039

(22) PCT Filed: Oct. 12, 2016

(86) PCT No.: PCT/JP2016/080276
§ 371 (c)(1),
(2) Date: Nov. 14, 2017

(87) PCT Pub. No.: WO2017/069027
PCT Pub. Date: Apr. 27, 2017

(65) Prior Publication Data
US 2018/0298506 A1 Oct. 18, 2018

(30) Foreign Application Priority Data

Oct. 19, 2015 (JP) ................. 2015-205923

(51) Int. Cl.
*C22B 9/04* (2006.01)
*C25C 1/14* (2006.01)
(Continued)

(52) U.S. Cl.
CPC ............. *C25C 1/14* (2013.01); *C22B 9/04* (2013.01); *C22B 25/08* (2013.01); *G03F 7/70008* (2013.01); *H05G 2/005* (2013.01)

(58) Field of Classification Search
CPC .. C22B 25/08; C22B 9/04; C25C 1/14; G03F 7/70008; H05G 2/005
See application file for complete search history.

(56) References Cited

U.S. PATENT DOCUMENTS

2009/0098012 A1  4/2009  Shindo et al.
2012/0195822 A1  8/2012  Werner et al.
(Continued)

FOREIGN PATENT DOCUMENTS

CN    1837413 A    9/2006
CN    101033557 A   9/2007
(Continued)

OTHER PUBLICATIONS

Higashiguchi, T., "Progress in Extreme Ultraviolet (EUV) Source Development," J. Plasma Fusion Res., vol. 89, No. 6, 341-348 (2013).

(Continued)

*Primary Examiner* — Colleen P Dunn
*Assistant Examiner* — Anthony M Liang
(74) *Attorney, Agent, or Firm* — Drinker Biddle & Reath LLP (57) ABSTRACT

Provided is a high purity tin (Sn) having an extremely low oxygen content. A high purity tin having a tin purity of 5N (99.999% by mass, provided that carbon, nitrogen, oxygen and hydrogen are excluded) or more, wherein the high purity tin has an oxygen content of less than 10 ppb by mass, as measured by elemental analysis using Dynamic-SIMS.

8 Claims, 2 Drawing Sheets

(51) Int. Cl.
*C22B 25/08* (2006.01)
*G03F 7/20* (2006.01)
*H05G 2/00* (2006.01)

(56) References Cited

U.S. PATENT DOCUMENTS

2013/0028786 A1   1/2013   Kanou
2013/0341196 A1   12/2013  Silinger et al.
2014/0332404 A1   11/2014  Shindo et al.

FOREIGN PATENT DOCUMENTS

| | | |
|---|---|---|
| JP | S621478 B2 | 1/1987 |
| JP | H01283398 | 11/1989 |
| JP | 228487 A | 9/1990 |
| JP | 2754030 B2 | 5/1998 |
| JP | H11343590 | 12/1999 |
| JP | 3882608 B2 | 2/2007 |
| JP | 5296269 B1 | 9/2013 |
| JP | 2014506554 | 3/2014 |
| TW | 201410921 A | 3/2014 |
| WO | 2011114824 A1 | 9/2011 |

OTHER PUBLICATIONS

International Search Report of International Application No. PCT/JP2016/080276.
International Preliminary Report on Patentability dated Apr. 19, 2018 for PCT/JP2016/080276, 5 pages.

HIGH PURITY TIN AND METHOD FOR MANUFACTURING SAME

TECHNICAL FIELD

The present invention relates to high purity tin (Sn) having extremely low oxygen content and a method for manufacturing the same.

BACKGROUND ART

Commercially available high purity tin is generally produced by an electrolytic method using an acidic tin solution such as tin sulfamate, tin sulfate, tin chloride or the like.

For example, Japanese Patent Application Laid-open Publication No. S62-1478 B (Patent Literature 1) describes a method for carrying out electrolysis in an electrolytic bath having a liquid composition containing 30 to 150 g/L of Sn and 30 to 200 g/L of sulfamic acid that contains few radioisotope elements, using 99 to 95% by weight or more of tin as an anode, under electrolytic conditions of a cathode current density of 0.5 to 2.0 Amp/$dm^2$ and a liquid temperature of 15 to 50° C., for the purpose of lowering a emission (claim 2 of Patent Literature 1).

Japanese Patent No. 2754030 B1 (Patent Literature 2) describes a method for producing tin characterized in carrying out electrolysis in an electrolytic solution containing 90 to 240 g/L of sulfuric acid that at least conforms to the standard of the first class grade sulfuric acid defined in JIS K 8951 and 10 to 50 g/L of hydrochloric acid that at least conforms to the standard of the first class grade hydrochloric acid defined in JIS K 8180 using tin having a purity of 99.97% by weight or more as an anode, for the purpose of lowering a emission (claim 1 of Patent Literature 2).

Japanese Patent 3882608 B1 (Patent Literature 3) describes a method for removing lead by electrolytic refining of impurities in metallic tin. More particularly, it describes a method of electrolytic refining of high purity tin using an electrolytic solution made from a mixed acid of sulfuric acid and silicofluoric acid, which includes withdrawing the tin electrolytic solution from an electrolytic bath and routing it to a precipitation tank; adding strontium carbonate to the electrolytic solution in the precipitation tank to precipitate lead in the solution at a liquid temperature of 35° C. or lower; then routing the electrolytic solution containing said precipitates to a filter unit to separate the precipitates by filtration; and recycling the precipitates-removed electrolytic solution to the electrolytic bath and carrying out electrolytic refining of tin (claim 1 of Patent Literature 3).

Japanese Patent No. 5296269 B1 (Patent Literature 4) discloses a method for conducting electrolytic refining by leaching tin as a raw material with an acid such as sulfuric acid to form a leached solution as an electrolytic solution, suspending an adsorbent for impurities in the electrolytic solution, conducting the electrolytic refining using a raw material Sn anode, thereby obtaining high purity tin having a purity of 5 N or more (excluding gas components of O, C, N, H, S and P). More particularly, it describes a method for conducing electrolytic refining in a sulfuric acid bath or a hydrochloric acid bath using tin having 3 N level as the anode at an electrolysis temperature of 10 to 80° C. and under a condition of a current density of 0.1 to 50 A/$dm^2$. It also discloses that impurities are adsorbed by suspending an oxide such as titanium oxide, aluminum oxide and tin oxide, as well as activated carbon, and carbon in the electrolytic solution.

On the other hand, non-Patent Literature 1 discloses that tin is used as a raw material of a tin droplet target used for generating an EUV (Extreme Ultraviolet) light source for lithography.

CITATION LIST

Patent Literature

Patent Literature 1: Japanese Patent Application Laid-open Publication No. S62-1478 B2
Patent Literature 2: Japanese Patent No. 2754030 B1
Patent Literature 3: Japanese Patent No. 3882608 B1
Patent Literature 4: Japanese Patent No. 5296269 B1

Non-Patent Literature

Takeshi Higashiguchi, Akira Endo and Kei Mizoguchi, "Current Status of EUV Light Source Development", Journal of Plasma and Fusion Research, The Japan Society of Plasma Science and Nuclear Fusion Research Vol. 89, No. 6, June 2013, p. 341-348

SUMMARY OF INVENTION

Technical Problem

According to the manufacturing method disclosed in the prior art, highly purified tin can be obtained. However, the present inventors have found that the use of tin obtained by the prior art as a raw material of a tin target material employed for generating EUV light in the EUV (Extreme Ultraviolet) light source for lithography, is likely to lead to clogging of nozzle of a droplet generator and disrupt the lithographic step when the tin target was heated in the EUV light source device and melted to form droplets having very small diameters of about several ten micrometers.

The present inventors have studied that cause, and found that tin electrolytically refined by a wet process using an electrolytic solution such as sulfuric acid contains a large amount of oxygen and sulfur (including a case where they are mixed as oxides and sulfides), and these contaminants adversely affect properties. According to the conventional wet process, metal impurities can be removed, but it is difficult to remove oxygen and sulfur.

The present invention has been made in view of the above circumstances. One of the objects of the present invention is to provide high purity tin having a very low oxygen content, and preferably high purity tin having very low oxygen and sulfur contents. Another object of the present invention is to provide a method for manufacturing high purity tin having a very low oxygen content, and preferably high purity tin having very low oxygen and sulfur contents.

Solution to Problem

As a result of extensive studies to solve the above problems, the present inventors have found that when electrolytically refined tin is heated under vacuum in a state where a certain amount of carbon is contained in the tin, oxygen in the form of free oxygen or oxide in the tin will react with carbon to form carbon monoxide or carbon dioxide which is removed by volatilization. Thus, the present inventions have found that extremely low oxygen concentration in tin can be achieved. Further, the present inventors have also found that by such operation, a sulfur content in tin is significantly reduced. Since sulfur has a high vapor pressure, it is removed as elementary sulfur by vacuum heating, as well the sulfur is also removed as a compound such as sulfur oxide, which is considered to contribute to reduction in the amount of oxygen and the amount of sulfur. The present invention has been accomplished based on the above findings.

In one aspect, the present invention provides a high purity tin having a tin purity of 5N (99.999% by mass, provided that carbon, nitrogen, oxygen and hydrogen are excluded) or more, wherein the high purity tin has an oxygen content of less than 10 ppb by mass, as measured by elemental analysis using Dynamic-SIMS.

In one embodiment of the high purity tin according to the present invention, the high purity tin has a sulfur content of less than 0.1 ppm by mass, as measured by elemental analysis using GD-MS.

In another embodiment of the high purity tin according to the present invention, the sulfur content is less than 0.01 ppm by mass, as measured by elemental analysis using GD-MS.

In yet another embodiment of the high purity tin according to the present invention, the high purity tin has a carbon content of less than 10 ppb by mass, as measured by elemental analysis using Dynamic-SIMS.

In another aspect, the present invention provides a method for manufacturing a high purity tin, including subjecting tin having a purity of 3N (99.9% by mass, provided that carbon, nitrogen, oxygen and hydrogen are excluded) or more, and having an oxygen content of 5 ppm by mass or more and a carbon content of 10 ppm by mass or more as measured by elemental analysis using a nondispersive infrared absorption method, to a vacuum heating treatment until the oxygen content in the tin is decreased to be less than 10 ppb by mass as measured by elemental analysis using Dynamic-SIMS.

In one embodiment of the method for manufacturing the high purity tin according to the present invention, the vacuum heating treatment is carried out at a temperature of 400° C. or more and a degree of vacuum higher than $1 \times 10^{-3}$ Pa (absolute pressure).

In another embodiment of the method for manufacturing the high purity tin according to the present invention, the vacuum heating treatment is carried out for 3 hours or more.

In yet another embodiment of the method for manufacturing the high purity tin according to the present invention, further including electrolytically refining raw material tin using an electrolytic solution containing at least one carbon-containing compound to obtain the tin, wherein the raw material tin has a purity of 3N (99.9% by mass, provided that carbon, nitrogen, oxygen and hydrogen are excluded) or more, and has an oxygen content of 5 ppm by mass or more and a carbon content of less than 10 ppm by mass, as measured by elemental analysis using a nondispersive infrared absorption method.

In yet another embodiment of the method for manufacturing the high purity tin according to the present invention, the at least one carbon-containing compound is a leveling agent.

In yet another embodiment of the method for manufacturing the high purity tin according to the present invention, it further includes adding elemental carbon to a raw material tin to obtain the tin, wherein the raw material tin has a purity of 3N (99.9% by mass, provided that carbon, nitrogen, oxygen and hydrogen are excluded) or more, and has an oxygen content of 5 ppm by mass or more and a carbon content of less than 10 ppm by mass, as measured by elemental analysis using a nondispersive infrared absorption method.

In yet another embodiment of the method for manufacturing the high purity tin according to the present invention, carbon atom is present at a ratio of 1 mole or more and 500 mole or less per 1 mole of oxygen atom in the tin.

In yet another embodiment of the method for manufacturing the high purity tin according to the present invention, carbon atom is present at a ratio of 50 mole or more and 100 mole or less per 1 mole of oxygen atom in the tin.

In another aspect, the present invention provides a tin target material made of the high purity tin according to the present invention, used for generating EUV light in a lithographic EUV light source.

Advantageous Effects of Invention

According to an embodiment of the present invention, free oxygen and oxides present on the surface as well as in the inside can be effectively reduced, so that it is possible to obtain high purity tin having an oxygen content of less than 10 ppb by mass, as measured by elemental analysis using secondary ion mass spectrometry (hereinafter referred to as "Dynamic-Secondary Ion Mass Spectrometry: Dynamic-SIMS"). According to another embodiment of the present invention, it is possible to obtain high purity tin having a carbon content of less than 10 ppb by mass, as measured by elemental analysis using Dynamic-SIMS. According to still another embodiment of the present invention, it is possible to obtain high purity tin having a sulfur content of less than 0.01 ppm by mass, as measured by elemental analysis using glow discharge mass spectrometry (hereinafter referred to as Glow Discharge Mass Spectrometry: GD-MS).

DESCRIPTION OF THE PREFERRED EMBODIMENTS

Figure 1:
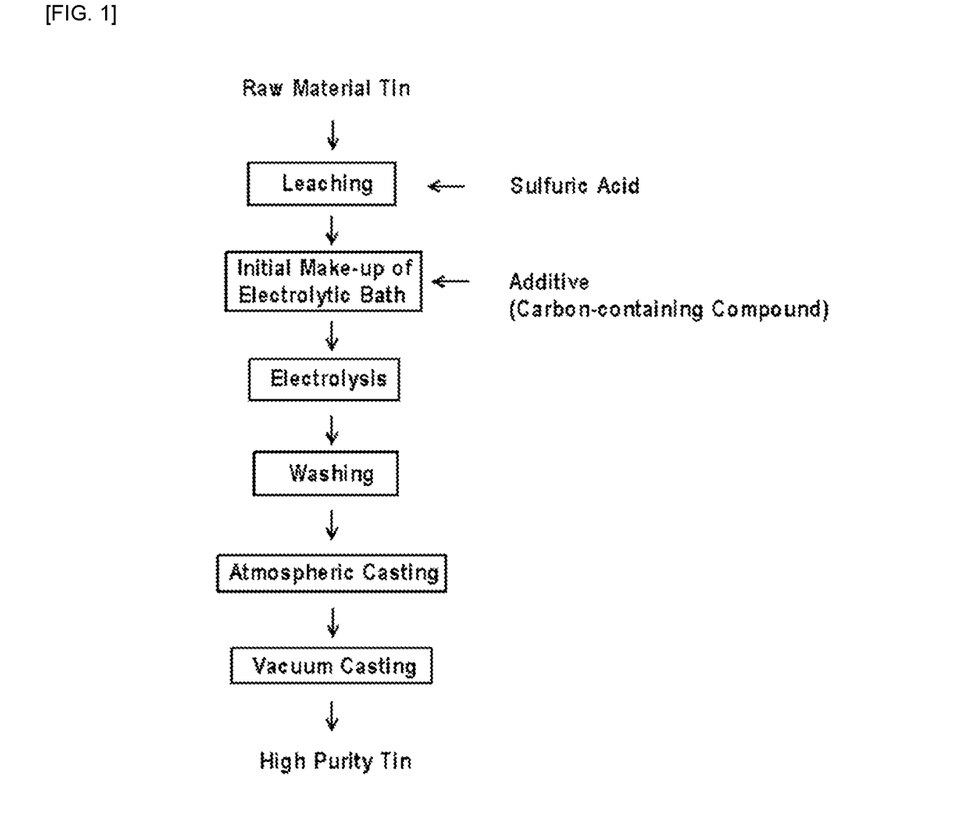
FIG. 1 is a process flow chart showing an example of a refining method in the case of adding a carbon-containing compound during electrolysis of tin (Examples 1 to 4).
Figure 2:
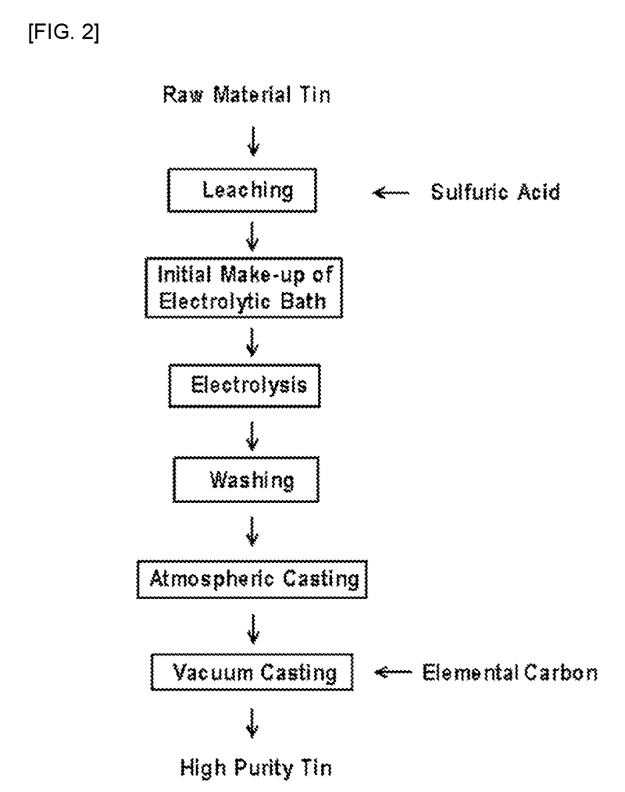
FIG. 2 is a process flow chart showing an example of a refining method in the case of adding elemental carbon during vacuum heating treatment (Examples 5 to 8).

Embodiments of the present invention will be described in detail below. In one embodiment, the method for manufacturing a high purity tin includes subjecting tin having a purity of 3N (99.9% by mass) or more, and having an oxygen content of 5 ppm by mass or more and a carbon content of 10 ppm by mass or more as measured by elemental analysis using a nondispersive infrared absorption method, to a vacuum heating treatment such that the oxygen content in the tin is decreased to be less than 10 ppb by mass as measured by elemental analysis using Dynamic-SIMS. The tin purity described in the present invention is a value excluding carbon, nitrogen, oxygen and hydrogen and can be measured by the GD-MS method. The measurements of impurity elements contained in the high purity tin means results obtained by the analysis of targeted 73 impurity element components of Li, Be, B, F, Na, Mg, Al, Si, P, S, Cl, K, Ca, Sc, Ti, V, Cr, Mn, Fe, Co, Ni, Cu, Zn, Ga, Ge, As, Se, Br, Rb, Sr, Y, Zr, Nb, Mo, Ru, Rh, Pd, Ag, Cd, In, Sb, Te, I, Cs, Ba, La, Ce, Pr, Nd, Sm, Eu, Gd, Tb, Dy, Ho, Er, Tm, Yb, Lu, Hf, Ta, W, Re, Os, Ir, Pt, Au, Hg, Tl, Pb, Bi, Th and U, when the tin is considered to be a matrix.

As a result of mass spectrometric analysis by the GD-MS method, one embodiment of the high purity tin according to the present invention shows that each of Li, Be, B, F, Na, Mg, Al, Si, Cl, K, Ca, Sc, Ti, V, Cr, Mn, Co, Ni, Zn, Ga, Ge, As, Se, Br, Rb, Sr, Y, Zr, Nb, Mo, Ru, Rh, Pd, Ag, Cd, In, Te, I, Cs, Ba, La, Ce, Pr, Nd, Sm, Eu, Gd, Tb, Dy, Ho, Er, Tm, Yb, Lu, Hf, Ta, W, Re, Os, Ir, Pt, Au, Hg, Tl, Th and U is less than a detection limit. In the present invention, the expression "less than a detection limit" means that Sc and V are less than 0.001 ppm by mass; Li, Be, B, Ti, Cr, Mn, Fe, Cu, Ga, As, Rb, Sr, Y, Zr, Nb, Rh, Pd, Ag, Ce, Nd, Sm, Gd, Tb, Dy, Ho, Er, Tm, Yb, Lu, Bi, Th and U are less than 0.005 ppm by mass; Na, Mg, Al, Si, P, S, Cl, K, Ca, Co, Ni, Zn, Ge, Se, Mo, Ru, Eu, Hf, W, Re, Os, Ir, Pt and Pb are less than 0.01 ppm by mass; Tl is less than 0.02 ppm by mass; F, Br, Cd, I, Cs, Au and Hg are less than 0.05 ppm by mass; Te, Ba, La and Pr are less than 0.1 ppm by mass; Sb is less than 0.5 ppm by mass; In is less than 1 ppm by mass; and Ta is less than 5 ppm by mass. The element concentration less than the detection limit is considered to be zero.

(A. Raw Material Tin)

A commercially available raw material tin having a purity at a level of 2N (purity 99% by mass) contains a large number of impurities and contaminants. For example, the raw material tin contains compounds in which oxygen or sulfur is bonded to tin, such as tin oxide (SnO, $SnO_2$) or tin sulfide (SnS, $SnS_2$), and contaminants (non-metallic inclusions such as $SiO_2$ from the outside of the system) on the surface and the inside. Further, the raw material tin contains a large amount of compounds of metals such as iron, lead, zinc and copper which will be the contaminants in tin.

Therefore, considering that the use of tin having a lower purity gives a burden to a refining step, the raw material tin may preferably have a purity of 99.9% by mass (3N) or more, and more preferably have a purity of 99.995% by mass (4N5) or more with the exception of carbon, nitrogen, oxygen and hydrogen. However, if the raw material tin having excessively high purity is used, economic efficiency will be deteriorated. Therefore, the raw material tin may typically has a purity of from 99.9 to 99.99% by mass (from 3N to 4N), and more typically a purity of from 99.95 to 99.98% by mass (from 3N5 to 3N8). Such high purity raw material tin may typically have an oxygen content of 5 ppm by mass or more, and more typically from 10 to 50 ppm by mass, as measured by elemental analysis using the nondispersive infrared absorption method, and may typically have a sulfur content of 0.5 ppm by mass or more, and more typically from 1 to 30 ppm by mass, as measured by elemental analysis using the GD-MS method.

In the present invention, oxygen contained in the raw material tin is removed using carbon. Therefore, tin before the vacuum heating treatment will need to contain carbon at a predetermined concentration. A suitable carbon content may vary depending on the oxygen content, but the carbon atom may be preferably present at a ratio of one mole or more, and more preferably 10 mole or more, and even more preferably 50 mole or more per one mole of oxygen atom, in terms of removal efficiency of oxygen. However, if the carbon content in tin before the vacuum heating treatment is too high, unreacted carbon will float on the surface of molten tin during the vacuum heating treatment and will be a waste. Therefore, the carbon atom may be preferably present at a ratio of 500 mole or less, and more preferably 100 mole or less per one mole of oxygen atom.

(B. Electrolytic Refining)

A commercially available Tin having a purity of 3N or more often has a lower carbon concentration of less than 10 ppm by mass. In such a case, the carbon content in the tin can be increased so as to obtain a concentration of from 10 to 100 ppm by mass, by subjecting the tin having a purity of 3N or more as a raw material to electrolytic refining, adding elemental carbon to the resulting electrolytically refined tin and carrying out the vacuum heating treatment as described below, or subjecting the tin to electrolytic refining using an electrolytic solution containing at least one carbon-containing compound. The electrolytic refining can be carried out by electrolytic refining using the raw material tin as an anode, or by electrowinning after chemically leaching the raw material tin with sulfuric acid.

For sulfuric acid used in the sulfuric acid leaching, a pH of a tin sulfate solution after leaching may be preferably 1 or less in order to prevent generation of tetravalent tin.

The concentration of tin in the tin sulfate solution obtained by the sulfuric acid leaching may be preferably 30 g/L or more, and more preferably 50 g/L or more, and still more preferably 70 g/L or more, in order to increase productivity. Further, the concentration of tin may be preferably 120 g/L or less, and more preferably 100 g/L or less, for the reason that precipitation does not occur.

The temperature of sulfuric acid used for the sulfuric acid leaching may be preferably 100° C. or less, and more preferably 90° C. or less, and still more preferably 80° C. or less, for safety reasons. On the other hand, the temperature of sulfuric acid may be preferably 50° C. or more, and more preferably 60° C. or more, and still more preferably 70° C. or more, in terms of reaction kinetics.

Tin may be electrodeposited on the cathode by electrowinning from a sulfuric acid-acidic tin sulfate electrolytic solution obtained by sulfuric acid leaching. For the reason of reducing an oxide layer, the electrodeposited tin may be preferably in the form of a plate. The temperature of the electrolytic solution during electrowinning may be preferably 10° C. or more, and more preferably 20° C. or more, and even more preferably 30° C. or more, in order to decrease resistance of the electrolytic solution (increasing electric conductivity). On the other hand, the temperature may be preferably 80° C. or less, and more preferably 60° C. or less, and still more preferably 40° C. or less, for safety and economic reasons.

The current density during electrolytic refining may be preferably 0.1 $A/dm^2$ or more, and more preferably 0.5 $A/dm^2$, and even more preferably 1.0 $A/dm^2$ or more, in terms of productivity. Further, the current density during electrolytic refining may be preferably 10 $A/dm^2$ or less, and more preferably 5 $A/dm^2$ or less, and even more preferably 3 $A/dm^2$ or less, for the reason of suppressing the generation of tetravalent tin and of countermeasures against heat generation.

When at least one carbon-containing compound is added to the electrolytic solution, the concentration of the carbon-containing compound to be added to the electrolytic solution may vary depending on the content of carbon to be added to the tin, and the carbon-containing compound may be preferably added such that the relationship between the carbon concentration and the oxygen concentration in the tin is in the range as described above. As an example, the concentration of the carbon-containing compound in the electrolytic solution may be preferably from 0.01 to 100 g/L, and more preferably from 0.1 to 50 g/L, and even more preferably from 1 to 10 g/L.

The carbon-containing compound may be preferably a leveling agent. Since tin that is smooth and has small surface area can be thus obtained, an effect of suppressing generation of oxides on the surface can also be provided. The leveling agent that can be used includes various surfactants such as anionic, cationic, nonionic or amphoteric surfactants. Among them, the nonionic surfactant can be preferably used because it does not contain sodium, potassium or the like. Examples of the nonionic surfactant include polyoxyethylene alkyl ether-based surfactants, polyoxyethylene alkyl phenyl ether-based surfactants, and polyoxyethylene alkyl amino ether-based surfactants.

Examples of the polyoxyethylene alkyl ether-based surfactants that can be suitably used include polyoxyethylene decyl ether, polyoxyethylene lauryl ether, polyoxyethylene cetyl ether, polyoxyethylene stearyl ether, polyoxyethylene oleyl ether, polyoxyethylene coconut alcohol ether, polyoxyethylene-2-ethylhexyl ether, polyoxyethylene synthetic alcohol ether, polyoxyethylene secondary alcohol ether, polyoxyethylene tridecyl ether and the like. Further, examples of the polyoxyethylene alkyl phenyl ether-based surfactants that can be suitably used include polyoxyethylene octyl phenyl ether, polyoxyethylene nonyl phenyl ether, polyoxyethylene cumyl phenyl ether, polyoxyethylene polynuclear phenyl ether, polyoxyethylene-β-naphthol ether, polyoxyethylene bisphenol-A-ether, polyoxyethylene dodecyl phenyl ether, polyoxyethylene styrenated phenyl ether, nonylphenol novolac EO adducts and the like. Further, examples of the polyoxyethylene alkyl amino ether-based surfactants that can be suitably used include polyoxyethylene lauryl amino ether, polyoxyethylene beef tallow amino ether, polyoxyethylene oleyl amino ether, polyoxyethylene stearyl amino ether, EO adducts of N,N-bis(2-hydroxyethyl)-N-cyclohexylamine and the like.

Examples of other leveling agents include β-naphthol, β-naphthol-6-sulfonic acid, β-naphthalenesulfonic acid, m-chlorobenzaldehyde, p-nitrobenzaldehyde, p-hydroxybenzaldehyde, (o-, p-)methoxybenzaldehyde, vanillin, (2,4-, 2,6-)dichlorobenzaldehyde, (o-, p-)chlorobenzaldehyde, 1-naphthaldehyde, 2-naphthaldehyde, 2(4)-hydroxy-1-naphthaldehyde, 2(4)-chloro-1-naphthaldehyde, 2(3)-thiophenecarboxyaldehyde, 2(3)-furaldehyde, 3-indolecarboxyaldehyde, salicylaldehyde, o-phthalaldehyde, formaldehyde, acetaldehyde, paraldehyde, butylaldehyde, isobutylaldehyde, propionaldehyde, n-valeraldehyde, acrolein, crotonaldehyde, glyoxal, aldol, succindialdehyde, capronaldehyde, isovaleraldehyde, allylaldehyde, glutaraldehyde, 1-benzylidene-7-heptanal, 2,4-hexadienal, cinnamaldehyde, benzylcrotonaldehyde, amine-aldehyde condensates, mesityl oxide, isophorone, diacetyl, hexanedione-3,4, acetylacetone, 3-chlorobenzylideneacetone, sub.pyridylidene acetone, sub.fururidine acetone, sub.tenylidene acetone, 4-(1-naphthyl)-3-buten-2-one, 4-(2-furyl)-3-buten-2-one, 4-(2-thiophenyl)-3-buten-2-one, curcumin, benzylidene acetylacetone, benzalacetone, acetophenone, (2,4-, 3,4-)dichloroacetophenone, benzylidene acetophenone, 2-cinnamylthiophene, 2-(w-benzoyl)vinylfuran, vinylphenylketone, acrylic acid, methacrylic acid, ethacrylic acid, ethyl acrylate, methyl methacrylate, butyl methacrylate, crotonic acid, propylene-1,3-dicarboxylic acids, cinnamic acid, (o-, m-, p-)toluidine, (o-, p-)aminoaniline, aniline, (o-, p-)chloroaniline, (2,5-, 3,4-)chloromethylaniline, N-monomethylaniline, 4,4'-diaminodiphenylmethane, N-phenyl-(α-, β-)naphthylamine, methylbenztriazole, 1,2,3-triazine, 1,2,4-triazine, 1,3,5-triazine, 1,2,3-benztriazine, imidazole, 2-vinylpyridine, indole, quinoline, reaction products of monoethanolamine with o-vanillin, polyvinyl alcohol, catechol, hydroquinone, resorcin, polyethyleneimine, disodium ethylenediaminetetraacetate, polyvinylpyrrolidone and the like.

Also, other leveling agents that can be effectively used include gelatin, polypeptone, N-(3-hydroxybutylidene)-p-sulfanilic acid, N-butylidenesulfanilic acid, N-cinnamoylidenesulfanilic acid, 2,4-diamino-6-(2'-methylimidazolyl (1'))ethyl-1,3,5-triazine, 2,4-diamino-6-(2'-ethyl-4-methylimidazolyl(1'))ethyl-1,3,5-triazine, 2,4-diamino-6-(2'-undecylimidazolyl(1'))ethyl-1,3,5-triazine, phenyl salicylate, or benzothiazoles. Examples of the benzothiazoles include benzothiazole, 2-methylbenzothiazole, 2-mercaptobenzothiazole, 2-(methyl mercapto)benzothiazole, 2-aminobenzothiazole, 2-amino-6-methoxybenzothiazole, 2-methyl-5-chlorobenzothiazole, 2-hydroxybenzothiazole, 2-amino-6-methylbenzothiazole, 2-chlorobenzothiazole, 2,5-dimethylbenzothiazole, 6-nitro-2-mercaptobenzothiazole, 5-hydroxy-2-methylbenzothiazole, 2-benzothiazolethioacetic acid and the like.

(C. Vacuum Heating Treatment)

Vacuum heating of tin with the increased carbon concentration as needed significantly reduces the oxygen concentration and the sulfur concentration in tin. When the tin is vacuum-heated, oxygen forming free oxygen or an oxide in the tin reacts with carbon to form carbon monoxide or carbon dioxide which will be removed by volatilization. Further, by this operation, the sulfur content in the tin is also significantly reduced in the form of a compound such as elemental sulfur or sulfur oxide.

As described above, when elemental carbon is added to the electrolytically refined tin, the elemental carbon can be added during vacuum heating. Specifically, powdered elemental carbon is added to the electrolytically refined tin in a vacuum melting state. The elemental carbon includes, but not particularly limited to, graphite, carbon nanotubes, carbon fibers, fullerene, diamond and the like. The elemental carbon may preferably have an average particle size of from 1 to 1000 μm, and more preferably from 30 to 500 μm, and still more preferably from 50 to 200 μm, in terms of dispersion and reactivity. In the present invention, the average particle diameter of the elemental carbon is defined as D50 by volume, when measuring the particle size distribution by a laser diffraction scattering method.

In order to significantly reduce the oxygen concentration in tin, the temperature, the degree of vacuum and the retention time of the vacuum heating treatment are important parameters. The temperature during the vacuum heating treatment may be preferably 400° C. or higher, and more preferably 600° C. or higher, and even more preferably 800° C. or higher, in terms of accelerating the reaction of oxygen with carbon, and further the reaction of oxygen with sulfur. However, although the temperature during the vacuum heating treatment has a relation with the degree of vacuum, tin will evaporate if the temperature is too high. Therefore, the temperature may be preferably 1200° C. or lower, and more preferably 1100° C. or lower, and more preferably 1000° C. or lower. The degree of vacuum during the vacuum heating treatment may be preferably higher than $1\times10^{-3}$ Pa (absolute pressure), and more preferably higher than $1\times10^{-4}$ Pa, and even more preferably higher than $1\times10^{-5}$ Pa, in terms of effectively removing carbon monoxide or carbon dioxide produced by the reaction of oxygen with carbon, free oxygen present in the tin, and further sulfur fraction such as elemental sulfur and sulfur oxide from the tin. However, the degree of vacuum during the vacuum heating treatment of higher than $1\times10^{-5}$ Pa may not be desirable, in terms of economic efficiency including facility.

The duration of the vacuum heating treatment may be a time required for sufficiently decrease the oxygen concentration and the sulfur concentration in the tin. For example, the duration may be, for example, from 1 to 30 hours. The duration may be preferably 3 hours or more, and more preferably 5 hours or more, in order to reduce the oxygen concentration and the sulfur concentration, whereas the duration may be preferably 25 hours or less, and more preferably 20 hours or less, in terms of production efficiency.

(D. High Purity Tin)

In one embodiment of the high purity tin according to the present invention, the oxygen content as measured by elemental analysis using Dynamic-SIMS can be less than 10 ppb by mass.

In one embodiment of the high purity tin according to the present invention, the sulfur content as measured by elemental analysis using GD-MS can be less than 0.1 ppm by mass, and preferably less than 0.05 ppm by mass, and more preferably less than 0.01 ppm by mass.

In one embodiment of the high purity tin according to the present invention, the carbon content as measured by elemental analysis using Dynamic-SIMS can be less than 10 ppb by mass, and preferably less than 5 ppb by mass.

EXAMPLES

Hereinafter, although Examples and Comparative Examples will be illustrated, these are provided for better understanding of the present invention, and the present invention is not intended to be limited due to the Examples and Comparative Examples.

Example 1

Commercially available massive tin having a purity of 4N (99.99% by mass, excluding carbon, nitrogen, oxygen and hydrogen) was prepared. Analysis of the tin by the nondispersive infrared absorption method showed that the carbon content was less than 1 ppm by mass and the oxygen content was 20 ppm by mass. Analysis of the tin by the GD-MS method showed that the sulfur content was 1 ppm by mass. The tin as a raw material was leached with 9N (normality) sulfuric acid at 80° C. for 20 hours to prepare a sulfuric acid-acidic tin sulfate solution (a tin sulfate concentration of 80 g/L). A part of the sulfuric acid-acidic tin sulfate solution was removed, to which polyoxyethylene nonyl phenyl ether was added at a concentration of 8 g/L. Electrolysis was then carried out at an electrolytic solution temperature of 25° C. and at a current density of 1 A/dm$^2$ to electrodeposit smooth tin on a surface of a plate titanium cathode.

The resulting electrodeposited tin was heated to 300° C. in the atmosphere to obtain rectangular column shaped cast tin. Analysis of the atmospheric cast tin by the nondispersive infrared absorption method showed that the carbon content was 20 ppm by mass and the oxygen content was 10 ppm by mass. The sulfur content was 1 ppm by mass as measured by the GD-MS method. The atmospheric cast tin was placed in a furnace in a vacuum atmosphere and maintained at 800° C. under 1×10$^{-4}$ Pa for 15 hours for vacuum casting. The refined tin thus obtained was measured by Dynamic-SIMS, demonstrating that the oxygen content was less than 10 ppb by mass and the carbon content was less than 5 ppb by mass. The GD-MS demonstrated that the sulfur content was less than 0.01 ppm by mass. Further, analysis of impurity elements other than oxygen, carbon and sulfur by the GD-MS method demonstrated that all of 73 elements other than carbon, nitrogen, oxygen and hydrogen were less than the detection limit. Therefore, it was confirmed that the purity of the resulting refined tin was 6N (99.9999% by mass) or more.

Examples 2 to 4, Comparative Examples 1 to 3

The atmospheric cast tin of Example 1 was subjected to vacuum casting under various conditions as shown in Table 1-1 and Table 2. The oxygen and carbon contents in the refined tin after the treatment were analyzed by the Dynamic-SIMS method and the sulfur content was analyzed by the GD-MS method. The results are shown in Tables 1-1 and 2. For Examples 2 to 4, analysis of impurity elements other than oxygen, carbon and sulfur by the GD-MS method demonstrated that all of 73 elements other than carbon, nitrogen, oxygen and hydrogen were less than the detection limit. Therefore, it was confirmed that each purity of the refined tin of Examples 2 to 4 was 6N (99.9999% by mass) or more. Comparative Example 1 had the lower degree of vacuum, Comparative Example 2 had the lower maintaining temperature, and Comparative Example 2 had the shorter retention time, so that in each of these comparative examples, the desirable decrease in the oxygen content could not be achieved.

Example 5

Electrolysis was carried out at an electrolytic solution temperature of 27° C. and a current density of 3 A/dm$^2$ without adding any additive to the sulfuric acid-acidic tin sulfate solution in Example 1 to electrodeposit needle-like tin on a surface of a plate carbon cathode. The resulting electrodeposited tin was heated to 300° C. in the atmosphere to obtain cast tin. Analysis of the atmospheric cast tin by the nondispersive infrared absorption method showed that the carbon content was less than 1 ppm by mass, the oxygen content was 20 ppm by mass, and the sulfur content was 1.3 ppm by mass. To the atmospheric cast tin was added high purity graphite powder having an average particle diameter (D50) of 150 μm such that the carbon atom was at a ratio of 50 mole per one mole of oxygen atom in the atmospheric cast tin. It was placed in a vacuum atmosphere furnace, maintained at a temperature of 800° C. under 1×10$^{-4}$ Pa for 15 hours for vacuum casting and refining. The refined tin thus obtained was measured by Dynamic-SIMS, demonstrating that the oxygen content was less than 10 ppb by mass, and the carbon content was less than 5 ppb by mass. The GD-MS demonstrated that the sulfur content was less than 0.01 ppm by mass. Further, analysis of impurity elements other than oxygen, carbon and sulfur by the GD-MS method demonstrated that all of 73 elements other than carbon, nitrogen, oxygen and hydrogen were less than the detection limit. Therefore, it was confirmed that the refined tin of Example 5 had a purity of 6N (99.9999% by mass) or more.

Examples 6 to 8, Comparative Examples 4 to 5

The atmospheric casted tin of Example 5 was subjected to vacuum casting under various conditions as shown in Table 1-2 and Table 2. The oxygen and carbon contents in the refined tin after the treatment were analyzed by the Dynamic-SIMS method, and the sulfur content was analyzed by GD-MS. The results are shown in Table 1-2 and Table 2. For Examples 6 to 8, analysis of impurity elements other than oxygen, carbon and sulfur by the GD-MS method demonstrated that all of the impurities other than carbon, nitrogen, oxygen and hydrogen were less than the detection limit. Therefore, it was confirmed that each purity of the refined tin of Examples 6 to 8 was 6N (99.9999% by mass) or more. Comparative Example 4 had the decreased addition amount of elemental carbon, and Comparative Example 5 did not add elemental carbon, so that in each of these comparative examples, the desirable decrease in the oxygen content could not be achieved.

TABLE 1-1

|  | Example 1 | Example 2 | Example 3 | Example 4 |
| --- | --- | --- | --- | --- |
| Addition Amount of Leveling Agent (g/L) | 8 | 8 | 8 | 8 |
| Oxygen Content Before Vacuum Heating Treatment (ppm by mass) | 10 | 10 | 10 | 10 |
| Sulfur Content Before Vacuum Heating Treatment (ppm by mass) | 1 | 1 | 1 | 1 |
| Carbon Content Before Vacuum Heating Treatment (ppm by mass) | 20 | 20 | 20 | 20 |
| Addition Amount of Elemental Carbon mol/mol - oxygen | None | None | None | None |
| Degree of Vacuum (Pa) | $1 \times 10^{-4}$ | $1 \times 10^{-4}$ | $1 \times 10^{-4}$ | $1 \times 10^{-5}$ |
| Maintaining Temperature (°C.) | 800 | 900 | 600 | 600 |
| Retention time (h) | 15 | 10 | 20 | 15 |
| Oxygen Content (ppb by mass) | <10 | <10 | <10 | <10 |
| Sulfur Content (ppm by mass) | <0.01 | <0.01 | <0.01 | <0.01 |
| Carbon Content (ppb by mass) | <5 | <5 | <5 | <5 |

TABLE 1-2

|  | Example 5 | Example 6 | Example 7 | Example 8 |
| --- | --- | --- | --- | --- |
| Addition Amount of Leveling Agent (g/L) | None | None | None | None |
| Oxygen Content Before Vacuum Heating Treatment (ppm by mass) | 20 | 20 | 20 | 20 |
| Sulfur Content Before Vacuum Heating Treatment (ppm by mass) | 1.3 | 1.3 | 1.3 | 1.3 |
| Carbon Content Before Vacuum Heating Treatment (ppm by mass) | <1 | <1 | <1 | <1 |
| Addition Amount of Elemental Carbon mol/mol - oxygen | 50 | 70 | 20 | 30 |
| Degree of Vacuum (Pa) | $1 \times 10^{-4}$ | $1 \times 10^{-4}$ | $1 \times 10^{-5}$ | $1 \times 10^{-5}$ |
| Maintaining Temperature (°C.) | 800 | 800 | 900 | 900 |
| Retention time (h) | 15 | 20 | 15 | 20 |
| Oxygen Content (ppb by mass) | <10 | <10 | <10 | <10 |
| Sulfur Content (ppm by mass) | <0.01 | <0.01 | <0.01 | <0.01 |
| Carbon Content (ppb by mass) | <5 | <5 | <5 | <5 |

TABLE 2

|  | Comparative Example 1 | Comparative Example 2 | Comparative Example 3 | Comparative Example 4 | Comparative Example 5 |
| --- | --- | --- | --- | --- | --- |
| Addition Amount of Leveling Agent (g/L) | 8 | 8 | 8 | None | None |
| Oxygen Content Before Vacuum Heating Treatment (ppm by mass) | 10 | 10 | 10 | 20 | 20 |
| Sulfur Content Before Vacuum Heating Treatment (ppm by mass) | 1 | 1 | 1 | 1.3 | 1.3 |
| Carbon Content Before Vacuum Heating Treatment (ppm by mass) | 20 | 20 | 20 | <1 | <1 |
| Addition Amount of Elemental Carbon mol/mol - oxygen | None | None | None | 0.5 | 0.0 |
| Degree of Vacuum (Pa) | $1 \times 10^{-2}$ | $1 \times 10^{-4}$ | $1 \times 10^{-4}$ | $1 \times 10^{-4}$ | $1 \times 10^{-5}$ |
| Maintaining Temperature (°C.) | 800 | 300 | 800 | 800 | 800 |
| Retention time (h) | 15 | 20 | 0.5 | 15 | 20 |
| Oxygen Content (ppb by mass) | 1200 | 1500 | 1500 | 10000~ | 10000~ |
| Sulfur Content (ppm by mass) | 0.7 | 0.9 | 1.0 | 0.5 | 0.8 |
| Carbon Content (ppb by mass) | <5 | <5 | <5 | <5 | <5 |

The refined tin obtained by vacuum casting was then melted and cast to produce a high purity tin ingot. The high purity tin ingot produced was used as a raw material of a tin target material used for generating EUV light in a lithographic EUV light source. As a result, the tin target did not result in clogging of a nozzle of a droplet generator when the tin target was heated and melted to produce droplets with a small diameter of about 25 µm.

The above results showed that the high purity tin ingots each having extremely low oxygen, carbon and sulfur contents, produced in Examples 1 to 8, had little deposition of silicon and carbon due to dust in the atmosphere and was barely influenced by atmospheric oxidation, and could sufficiently suppress contamination of impurities that would cause particles.

INDUSTRIAL APPLICABILITY

According to the present invention, it is possible to obtain a high purity tin having an extremely low content of oxygen in the tin, which oxygen has been conventionally difficult to be removed. According to the present invention, it is also possible to obtain a high purity tin having the lower sulfur content. The high purity tin from which oxygen and sulfur have been removed can prevent nozzle clogging due to oxides and sulfides and enables to obtain droplet tin with a stable shape. Therefore, such a high purity tin is useful as a tin target material in any form, used in the EUV light source.

What is claimed is:

1. A method for manufacturing a high purity tin, comprising subjecting tin having a purity of 3N (99.9% by mass, provided that carbon, nitrogen, oxygen and hydrogen are excluded) or more, and having an oxygen content of 5 ppm by mass or more and a carbon content of 10 ppm by mass or more as measured by elemental analysis using a nondispersive infrared absorption method, to a vacuum heating treatment until the oxygen content in the tin is decreased to be less than 10 ppb by mass as measured by elemental analysis using Dynamic-SIMS.

2. The method according to claim 1, wherein the vacuum heating treatment is carried out at a temperature of 400° C. or more and a degree of vacuum higher than $1 \times 10^{-3}$ Pa (absolute pressure).

3. The method according to claim 1, wherein the vacuum heating treatment is carried out for 3 hours or more.

4. The method according to claim 1, further comprising electrolytically refining a raw material tin using an electrolytic solution containing at least one carbon-containing compound to obtain the tin having the purity of 3N (99.9% by mass, provided that carbon, nitrogen, oxygen and hydrogen are excluded) or more, and having the oxygen content of 5 ppm by mass or more and the carbon content of 10 ppm by mass or more as measured by elemental analysis using the nondispersive infrared absorption method, wherein the raw material tin has a purity of 3N (99.9% by mass, provided that carbon, nitrogen, oxygen and hydrogen are excluded) or more, and has an oxygen content of 5 ppm by mass or more and a carbon content of less than 10 ppm by mass, as measured by elemental analysis using a nondispersive infrared absorption method.

5. The method according to claim 4, wherein the at least one carbon-containing compound is a leveling agent.

6. The method according to claim 1, further comprising adding elemental carbon to a raw material tin to obtain the tin having the purity of 3N (99.9% by mass, provided that carbon, nitrogen, oxygen and hydrogen are excluded) or more, and having the oxygen content of 5 ppm by mass or more and the carbon content of 10 ppm by mass or more as measured by elemental analysis using the nondispersive infrared absorption method, wherein the raw material tin has a purity of 3N (99.9% by mass, provided that carbon, nitrogen, oxygen and hydrogen are excluded) or more, and has an oxygen content of 5 ppm by mass or more and a carbon content of less than 10 ppm by mass, as measured by elemental analysis using a nondispersive infrared absorption method.

7. The method according to claim 1, wherein carbon atom is present at a ratio of 1 mole or more and 500 mole or less per 1 mole of oxygen atom in the tin having the purity of 3N (99.9% by mass, provided that carbon, nitrogen, oxygen and hydrogen are excluded) or more, and having the oxygen content of 5 ppm by mass or more and the carbon content of 10 ppm by mass or more as measured by elemental analysis using the nondispersive infrared absorption method.

8. The method according to claim 1, wherein carbon atom is present at a ratio of 50 mole or more and 100 mole or less per 1 mole of oxygen atom in the tin having the purity of 3N (99.9% by mass, provided that carbon, nitrogen, oxygen and hydrogen are excluded) or more, and having the oxygen content of 5 ppm by mass or more and the carbon content of 10 ppm by mass or more as measured by elemental analysis using the nondispersive infrared absorption method.

* * * * *